United States Patent [19]

Miller

[11] Patent Number: 4,469,500
[45] Date of Patent: Sep. 4, 1984

[54] METHOD OF CLEAVING A CRYSTAL TO PRODUCE A HIGH OPTICAL QUALITY CORNER

[75] Inventor: Arthur Miller, Princeton Junction, N.J.

[73] Assignee: RCA Corporation, New York, N.Y.

[21] Appl. No.: 381,734

[22] Filed: May 24, 1982

Related U.S. Application Data

[63] Continuation-in-part of Ser. No. 228,594, Jan. 26, 1981, abandoned.

[51] Int. Cl.$^3$ .............................................. H01L 31/18
[52] U.S. Cl. .............................................. 65/112; 65/2; 83/880; 83/881; 83/32; 225/2; 225/96.5; 350/96.1; 350/96.12
[58] Field of Search .............. 29/583, DIG. 15, 16, 29/569 L; 225/2, 96.5; 156/647, 662; 83/879, 880, 881, 32; 65/56, 105, 112, 174, 2; 125/23 R, 30 R; 63/26, 32; 350/96.1, 96.12

[56] References Cited

U.S. PATENT DOCUMENTS

| | | | |
|---|---|---|---|
| 1,738,228 | 12/1929 | Campbell et al. | 225/2 |
| 3,247,576 | 4/1966 | Dill, Jr. et al. | 29/583 |
| 3,341,937 | 9/1967 | Dill, Jr. | 29/583 |
| 3,520,456 | 7/1970 | Augustin et al. | 225/2 |
| 3,584,773 | 6/1971 | Grove et al. | 225/2 |
| 3,626,511 | 12/1971 | Hammer | 350/160 |
| 3,731,861 | 5/1973 | Busch | 125/23 R X |
| 3,934,773 | 1/1976 | Chinnock et al. | 225/2 |
| 4,039,309 | 8/1977 | Albanese et al. | 65/112 X |
| 4,202,475 | 5/1980 | Hirai et al. | 225/96.5 X |
| 4,216,004 | 8/1980 | Brehm et al. | 65/174 X |
| 4,256,246 | 3/1981 | Kindel | 225/96.5 X |
| 4,306,351 | 12/1981 | Ohsaka et al. | 29/569 L |

FOREIGN PATENT DOCUMENTS 25690 3/1981 European Pat. Off. .

OTHER PUBLICATIONS

Gloge et al. "Optical Fiber End Preparation for Low-Loss Splices" Bell System Technical Journal, vol. 52, No. 9, Nov. 1973, pp. 1579-1588.

Khoe, et al., "Automatic Fabrication of Optical Fibre Ends: Perpendicular Fracture Mirrors in Glass Fibres, Coated Glass Fibres and Plastic-Clad Fibres" Sixth European Conference on Optical Communication, York, England, Sep. 1980, pp. 286-289.

"Single-Mode Coupling Between Fibers and Indiffused Waveguides", H. P. Hsu and A. F. Milton *IEEE Journal of Quantum Electronics,* vol. OE-13, No. 4, Apr. 1977 pp. 224-233.

"Flip-Chip Approach to Endfire Coupling Between Single-Mode Optical Fibres and Channel Waveguides", H. P. Hsu and A. F. Milton, *Electronics Letters,* vol. 12, No. 16, Aug. 5, 1976, pp. 404-405.

"Efficient Second-Harmonic Generation in Three-Dimensional LiNbO$_3$ Optical Waveguide", N. Uesugi and T. Kimura, *Applied Physics Letters,* vol. 29, No. 9, Nov. 1, 1976, pp. 572-574.

*Primary Examiner*—Brian E. Hearn
*Assistant Examiner*—David A. Hey
*Attorney, Agent, or Firm*—Joseph S. Tripoli; Robert L. Troike; Robert Ochis

[57] ABSTRACT

A high optical quality corner is produced on a cleaved crystal which may include a stripe or surface optical waveguide by making a fracture initiation mark along only a portion of the surface intercept of the desired cleavage plane with a first of two major surfaces of the crystal and then tensioning the first major surface of the crystal to fracture the crystal along the desired cleavage plane beginning at the fracture initiation mark. This produces a high optical quality corner along a portion of the intersection of the newly cleaved surface with the major surface of the crystal. This high optical quality corner is located where no fracture initiation mark was made and enables the crystal to be used in as-cleaved form for end-fire coupling between its waveguide and an external waveguide such as an optical fiber.

7 Claims, 5 Drawing Figures

METHOD OF CLEAVING A CRYSTAL TO PRODUCE A HIGH OPTICAL QUALITY CORNER

This application is a continuation in part of application Ser. No. 228,594, filed Jan. 26, 1981, now abandoned.

This invention relates to the field of preparing optical surfaces on crystals and more particularly to the field of preparing such surfaces by crystal cleaving.

In integrated optics an optical waveguide is often formed along the surface of a crystal by modification of the index of refraction of a surface layer of the crystal. Such waveguides usually extend only about one or two microns into the surface of the crystal and may extend over the entire surface (surface waveguides) or be of restricted width (stripe waveguides). In order to make a useful optical device, light must be coupled into and out of this waveguide.

Prior art input and output structures have employed gratings on the surface of the waveguide or overlays over the waveguide structure. Such coupling structures have usually been found to be relatively inefficient when used to couple light between an optical fiber and the waveguide (usual efficiency a few percent or less).

End fire couplers in which light is coupled directly into the end of the waveguide at a face of the crystal which is approximately perpendicular to the plane of the waveguide are found to be much more efficient. In order to obtain efficient coupling with this technique, the end surface of the crystal must have a smooth or mirror-like surface extending to within a few thousand angstroms of the crystal major surface into which the waveguide has been formed. The intersection of this mirror-like surface with the smooth major surface of the crystal may be referred to as a high optical quality corner on the crystal.

In the prior art, such corners have been obtained by cleaving the crystal and then optically polishing the end surface of the crystal. Such techniques, although effective, are undesirably expensive and time consuming.

Gloge et al., in an article entitled "Optical Fiber End Preparation for Low-Loss Splices" in the *Bell System Technical Journal* for November 1973 at pages 1579–1588, describe a technique for achieving a mirror surface on the core of a clad optical fiber. In this technique, the cladding of the fiber is scribed and the fiber bent to initiate a fracture at the scribe line. The resulting fracture has the desired mirror surface on the fiber core. The mirror surface is oriented perpendicular to the axis of the fiber. Thus, an inexpensive reliable technique for providing the required surface on the end of an optical fiber has been achieved. This technique generally produces a poor optical quality surface on the cladding of the fiber, especially at the surface from which the fracture of the optical fiber is initiated. However, so long as this poor quality surface does not extend into the core of the fiber, good coupling efficiency is obtained. Unfortunately, this technique is not applicable to the fracture of crystals of the type used for optical waveguides since no thick cladding layer is present on such crystals.

Scribing a scribe line all the way across the major surface of the crystal on which the waveguide is located followed by cleaving the crystal by bending it away from the scribe line is only useful for integrated optics if the cleaved surface of the crystal is optically polished following the cleaving. This is because the scribe mark typically extends five to ten microns into the crystal and creates a rough surface there which produces a corner which is of poor optical quality. This depth is many times the depth of the waveguide. Only through very delicate control, and probably not by hand, is it possible to consistently make scribe marks on such crystals which do not extend substantially more than one micron into the crystal's surface.

Scribe across and break from the surface of the crystal opposite to the waveguide is usualy ineffective for overcoming these problems because the cleaved surface is normally rough at the major surface remote from the surface where the fracture begins.

Another technique for cleaving a crystal of this general type is discussed in U.S. Pat. No. 3,247,576 to Dill, Jr. et al. In this technique, the crystal to be cleaved is placed on a smooth rigid surface and a force is applied downward on the upper surface of the crystal with a razor blade or similar implement. The resulting stress causes the crystal to fracture along the cleavage plane. Use of this technique for the preparation of end faces on integrated optics waveguides requires subsequent optical polishing of the end face because the razor blade ruins the surface of the crystal to a greater depth than that to which the waveguide extends.

A reliable, inexpensive technique for cleaving an optical waveguide crystal is needed which obviates subsequent polishing.

In accordance with one embodiment of the present invention, a fracture initiation mark is made along only a portion of the intersection of a desired cleavage plane with a first of two opposed major surfaces of the crystal. The portion of that intersection where the high optical quality corner is desired is left free of externally induced fracture initiating imperfections. The crystal is then tensioned to strain the crystal along the fracture initiation mark in order to initiate a fracture of the crystal along the desired cleavage plane beginning at the fracture initiation mark. The resulting fracture of the crystal creates the desired high optical quality corner on the crystal where the newly cleaved crystal surface intersects the pre-existing first major face of the crystal within the region where no fracture initiation mark was made. When this method is used with a crystal having a waveguide along one major surface, the first major surface is the one the waveguide is along and that waveguide's light path is normally where the high optical quality corner is desired.

Figure 1:
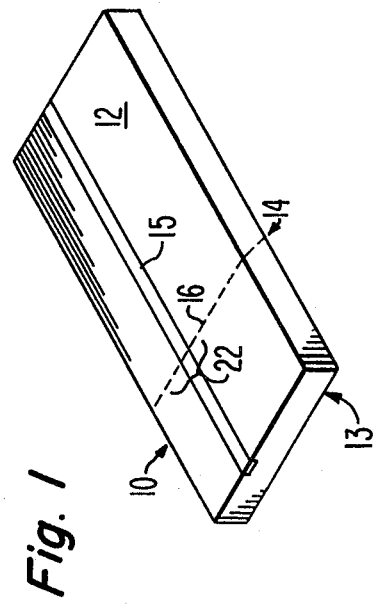
FIG. 1 illustrates a crystal including a stripe optical waveguide to be cleaved and the desired cleavage plane prior to crystal cleavage.

In FIG. 1 a crystal to be cleaved is shown generally at 10. This crystal has a first, substantially planar major face 12 and a second, opposed, substantially planar major face 13. Surfaces 12 and 13 together provide the crystal 10 with a substantially rectangular cross section. Crystal 10 has a desired cleavage plane 14 which intersects the surface 12 along a surface intercept 16. A stripe optical waveguide 15 located within and along the major surface 12 of crystal 10 crosses the cleavage plane 14 within a portion 22 of intercept 16. A high optical quality corner is desired along the portion 22 of the intercept 16 following cleavage to provide a high optical quality corner across the full width of the stripe waveguide 15 following cleavage.

For purposes of this specification, the term high optical quality corner is defined as meaning a corner on a crystal at which a mirror surface on one face of the crystal extends substantially to the intersection of that surface with another smooth or mirror quality surface or face of the crystal. This is estimated to be within 10 or 20Å of the pre-existing surface 12.

Figure 2:
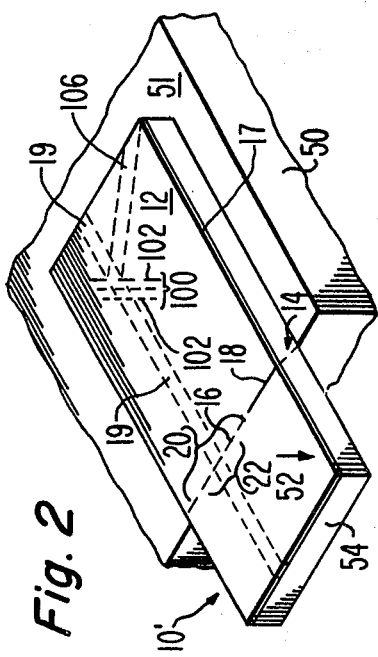
FIG. 2 illustrates a similar crystal including a surface waveguide with a fracture initiation mark in accordance with the invention.

In accordance with the invention, as illustrated in FIG. 2, a fracture initiation mark 18 is made on the first major surface of a crystal 10' along the surface intercept 16, but only for a portion of the length of that intercept and, in particular, not in the portion 22 of the intercept where the high optical quality corner is desired. A portion 20 of the intercept including portion 22 is left without fracture initiating imperfections. In FIG. 2 crystal 10' is illustrated with a surface waveguide 17 in which the intended eventual light propagation path 19 is between the dashed lines and of dimensions similar to those of stripe guide 15 in FIG. 1. Although the waveguide 17 is a surface waveguide, coupling between it and an optical fiber is restricted to light path 19, which is a region having a width about equal to the diameter of the fiber. The light remains in path 19 since it travels in a straight line unless it is deflected as by an active device 100 which may for example be a digital light deflector like that disclosed in U.S. Pat. No. 3,626,511 to J. M. Hammer. Device 100 includes a set of electrodes 102 on surface 12 and a matching aligned set or a ground plane (not shown) on surface 13. Application of a d.c. voltage to these electrodes to apply a field vertically through the crystal deflects the light from the straight path 19 into a new path 106. The type of waveguide has no discerned effect on crystal cleaving. With either type of waveguide the scribing is done in a location spaced from the light path which may be either a stripe guide or the light path region of a surface waveguide, that is, the scribe line is in a location remote from the region where optical coupling will take place in order to avoid scribing the coupling portion of the waveguide.

For cleaving, the crystal may be positioned on a smooth surface 51 of a rigid body 50 with the cleavage plane 14 just off the edge of the surface 51. The crystal is held against the surface 51 by means not shown. A fracture inducing force is then applied in the direction indicated by the arrow 52 so as to tend to bend the crystal 10 in a manner to tension the surface 12 in the vicinity of the fracture initiation mark 18. This may involve moving the end 54 of the crystal downwards in the figure (away from fracture initiation mark 18) or may involve tensioning the crystal alone or in combination with a bending force to initiate the fracture. The fracture initiation mark 18 concentrates the resuting stress along the surface intercept of the desired cleavage plane and/or makes the desired cleavage plane the point of minimum strength. As a result, the crystal 10 fractures with the fracture beginning along fracture initiation mark 18 and extending downward through the crystal along cleavage plane 14 and spreading laterally across the cleavage plane 14 and along the remainder 20 of the surface intercept 16.

Figure 3:
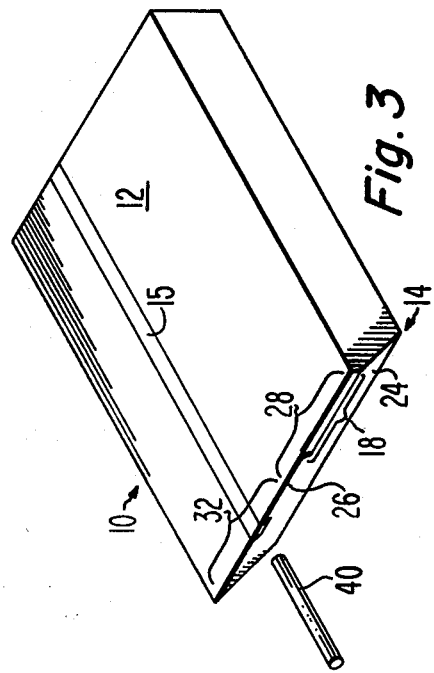
FIG. 3 illustrates a crystal following cleavage.

One portion of the crystal 10 again with a stripe waveguide is illustrated in FIG. 3 following cleavage. The newly formed cleaved surface 24 lies along the desired cleavage plane 14. The corner 26 between the cleaved surface 24 and the major surface 12 has both a poor optical quality portion 28 and a high optical quality portion 32. As illustrated, the poor optical quality portion of the corner 26 extends a short distance beyond the end of the fracture initiation mark 18. The remainder of the corner 26 is within the high optical quality portion 32 of the corner. In particular, the portion 22 of the corner where the high optical quality was desired is included in the high optical quality portion 32 of the corner. The other post-cleaving portion of the crystal 10 (which is not shown) also has a high optical quality corner along the intercept 16 in the region 22. Thus, two ready-to-use segments of the crystal are produced simultaneously without the need for further polishing of either segment. An optical fiber 40 is illustrated aligned with waveguide 15 for optically coupling to it.

Figure 5:
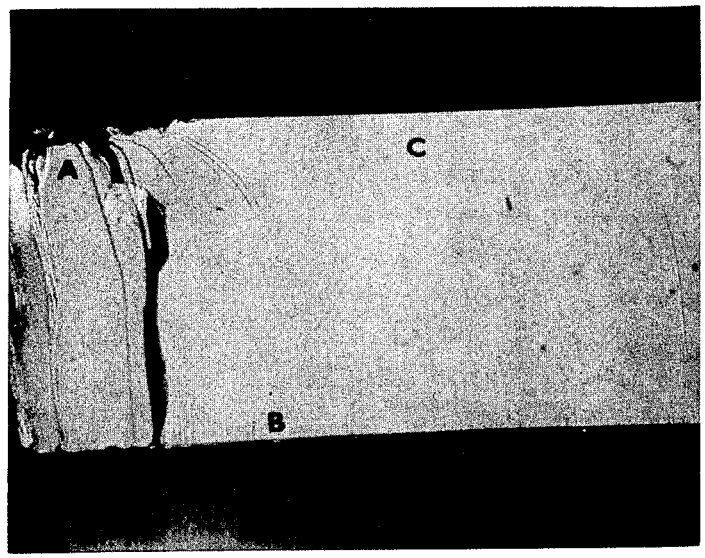
FIG. 5 is a photolithographic reproduction of a photomicrograph of the cleaved surface of a crystal having a surface waveguide which was cleaved in accordance with the preferred embodiment of the invention.

The freshly cleaved surface of a lithium tantalate crystal 10' cleaved in this manner is illustrated in a photomicrograph in FIG. 5. In this figure, the fracture initiating scribe line is identified by the reference letter A. The high optical quality corner of the crystal is identified by the reference letter C and a poor optical quality portion of the cleaved surface adjacent the major surface of the crystal from which cleavage was not initiated is identified by the reference letter B. The surface waveguide 17 is not visible in this figure because its slight refractive index change from that of the host crystal and the waveguide's thinness render the waveguide non-discernable. However, since the waveguide is only about several thousand angstroms thick, it extends into the crystal less than about 1/1000 of the crystal's thickness.

Figure 4:
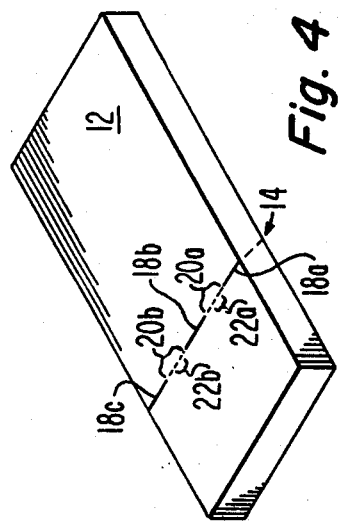
FIG. 4 illustrates a crystal prior to cleavage with a different fracture initiation mark on the crystal.

FIG. 4 illustrates an alternative manner of applying a fracture initiation mark 18 to the crystal when two or more non-contiguous portions of the cleaved corner need to be of high optical quality. In this technique, the fracture initiation mark 18 is made discontinous—here having three non-contiguous segments: 18a, 18b and 18c. The portion 20 of the surface intercept is thereby made discontinuous also—here having two non-contiguous segments, 20a and 20b. The two regions where the high optical quality corner is desired are 22a and 22b which occur in the middle portions of the respective intercept portions 20a and 20b. Fracture of this crystal will produce a fracture origination corner having two non-contiguous, substantially co-linear segments of high optical quality. These high quality segments will be separated from each other by a segment having poor optical quality.

It will be recognized that, if desired, a single region of high optical quality on the corner 26 can be obtained by providing a single section (20a) of the intercept 16 where no fracture initiation mark is present and having the fracture initiation mark have only two non-contiguous segments (18a and 18b in FIG. 4 with the portion 18b extending to the edge of the crystal). As a further alternative, two non-contiguous, substantially co-linear high optical quality segments of the corner may be obtained by omitting the segment 18c of the fracture initiation mark from the FIG. 4 configuration.

As illustrated in the figures, the desired cleavage plane 14 need not be perpendicular to the major surface 12 of the crystal. For facile coupling between the waveguide of the crystal and an external waveguide such as optical fiber 40, it is preferable that the cleavage plane be near to perpendicular to the major surface 12 of the crystal. However, the selection of and the angle of the desired cleavage plane is a matter of crystallography and (for integrated optics use of the cleaved crystal) optics. The inventive technique is generally successful in producing a high optical quality corner so long as the characteristics of the crystal are such that cleavage along the desired cleavage plane can be obtained by scribing the surface of the crystal and breaking it by tensioning the scribed surface of the crystal (as by bending the crystal away from the scribe line).

Generally, as in the prior art, the fracture initiation mark is made by scribing the surface of the crystal with a hard object such as a diamond; however, the fracture initiation mark may be applied by any other applicable technique including laser scribing, particle beam milling, and so forth, so long as the resulting fracture initiation mark is effective to initiate the fracture during crystal cleaving.

Utilizing the technique of this invention on lithium tantalate crystals into which surface lithium niobate waveguides had been diffused, high optical quality corners were obtained. These crystals were typically about 1½ cm on a side and between ½ mm and 1 mm thick with a waveguide depth of several thousand angstroms. Coupling efficiencies of more than 70% were obtained when an optical fiber 40 was aligned with the waveguide at the freshly cleaved surface of the crystal within about 1–10 μm of the cleaved surface but without having contacted the crystal. No index of refraction matching fluid was used. Naturally, the addition of an index of refraction matching fluid would improve even this excellent coupling efficiency.

The mirror surface portion of the new cleavage face 24 of the crystal is believed to extend all the way to smooth surface 12 of the crystal and certainly within 10 to 20 Å of the surface 12 in the lithium tantalate crystals discussed above. As shown by the coupling efficiency measurements, the mirror surface clearly extends sufficiently close to the surface 12 to provide the excellent coupling which typifies a high optical quality corner. This makes feasible the use of the crystal in as-cleaved form (i.e., without subsequent polishing) for end-fire coupling directly to fiberoptic cables or other transmission media.

A preferred technique for cleaving crystals to provide high optical quality corners without the need for subsequent polishing has been illustrated and described. Those skilled in the art will be able to modify the preferred embodiment without departing from the spirit of the invention. Protection for this invention is limited only by the scope of the appended claims.

What is claimed is:

1. A method of producing a high optical quality corner on a crystal having first and second opposed major surfaces and a desired cleavage plane intersecting said first major surface along an intercept, said first major surface being smooth, said crystal being capable of being fractured along said cleavage plane by a fracture beginning at said intercept, said method comprising:
   making a fracture initiation mark along only a first portion of said intercept where a poor optical quality corner on said crystal after cleaving is not detrimental;
   leaving a second portion of said intercept free of externally induced fracture initiating imperfections, said second portion of said intercept being located where it is desired to have a high optical quality corner on said crystal after cleaving; and
   tensioning said first surface of said crystal in the vicinity of said fracture initiation mark to fracture said crystal along said desired cleavage plane beginning at said fracture initiation mark to produce a cleaved surface having a mirror quality portion which extends to said first surface of said crystal along at least a part of said second portion of that portion of the intersection of said cleaved surface with said first major surface.

2. The method recited in claim 1 wherein:
said fracture initiation mark has at least first and second non-contiguous segments; and
at least a first part of said second portion of said intercept is located between said first segment of said fracture initiation mark and said second segment of said fracture initiation mark.

3. The method recited in claim 2 wherein:
said second portion of said intercept has at least first and second non-contiguous segments;
said first segment of said second portion of said intercept constitutes said first part of said second portion of said intercept; and
said second segment of said fracture initiation mark is between said first segment of said second portion of said intercept and said second segment of said second portion of said intercept, whereby said high optical quality corner has at least two separate non-contiguous segments which are substantially co-linear and separated from each other by a region of said cleaved surface along which said corner is not of high optical quality.

4. A method of preparing a crystal having an optical waveguide therein for coupling of light between said waveguide and an optical fiber, said crystal having first and second opposed major surfaces, said first surface being smooth, and a desired cleavage plane which intersects said first major surface along an intercept, said waveguide having a light path which crosses said cleavage plane, said crystal being capable of being fractured along said cleavage plane by a fracture beginning at said intercept, said method comprising:
   making a fracture initiation mark along only a first portion of said intercept, said first portion not including said waveguide light path;
   leaving a second portion of said intercept free of externally induced fracture initiating imperfections, said waveguide light path extending across said cleavage plane in said second portion; and
   tensioning said first major surface of said crystal in the vicinity of said fracture initiation mark to fracture said crystal beginning at said fracture initiation mark to produce a cleaved surface along said desired cleavage plane, said cleaved surface intersecting said first major surface in a high optical quality corner at least within the portion of said intercept which encompasses said waveguide light path to provide a ready-to-use end fire coupling surface on said waveguide light path.

5. The method recited in claim 4 wherein:
said fracture initiation mark has at least first and second non-contiguous segments; and
at least a first part of said second portion of said intercept is located between said first segment of said fracture initiation mark and said second segment of said fracture initiation mark.

6. The method recited in claim 5 wherein:

said second portion of said intercept has at least first and second non-contiguous segments;

said first segment of said second portion of said intercept constitutes said first part of said second portion of said intercept; and said second segment of said fracture initiation mark is between said first segment of said second portion of said intercept and said second segment of said second portion of said intercept.

7. A method of producing, on a crystal having a first smooth major planar surface and a desired cleavage plane intersecting said first planar surface along an intercept, a high optical quality corner along a desired optical coupling portion of said first surface, said crystal being capable of being fractured along said cleavage plane by a fracture beginning at said intercept, said method comprising:

making a fracture initiation mark on said first surface along only a first portion of said intercept which is remote from said desired optical coupling portion to leave free of externally induced fracture initiating imperfections a second portion of said intercept where it is desired to have a high optical quality corner on said crystal after cleaving, said second portion including said desired optical coupling portion of said first surface; and tensioning said first surface of said crystal in the vicinity of said fracture initiation mark to fracture said crystal along said desired cleavage plane beginning at said fracture initiation mark to produce a cleaved surface having a mirror quality portion which extends to said first surface of said crystal along at least the desired optical coupling part of said second portion of said intercept to provide a high optical quality corner along that portion of the intersection of said cleaved surface with said first planar surface.

* * * * *